United States Patent
Carlson et al.

(10) Patent No.: US 12,105,231 B2
(45) Date of Patent: Oct. 1, 2024

(54) SCINTILLATOR ARRAY FOR RADIATION DETECTION

(71) Applicant: National Technology & Engineering Solutions of Sandia, LLC, Albuquerque, NM (US)

(72) Inventors: Joseph Carlson, Castro Valley, CA (US); Patrick L. Feng, Livermore, CA (US); Nicholas Myllenbeck, Livermore, CA (US); Huu Tran, San Jose, CA (US); Lucas Nguyen, Oakland, CA (US); Melinda Sweany, Oakland, CA (US); Peter Marleau, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 18/144,544

(22) Filed: May 8, 2023

(65) Prior Publication Data
US 2023/0314634 A1    Oct. 5, 2023

Related U.S. Application Data

(62) Division of application No. 17/158,198, filed on Jan. 26, 2021, now Pat. No. 11,681,055.

(51) Int. Cl.
*G01T 1/20*    (2006.01)
*H01L 27/146*    (2006.01)

(52) U.S. Cl.
CPC ...... *G01T 1/2018* (2013.01); *H01L 27/14663* (2013.01); *H01L 27/14689* (2013.01)

(58) Field of Classification Search
CPC ................. G01T 1/2018; G01T 1/2033; H01L 27/14663; H01L 27/14689
See application file for complete search history.

(56) References Cited

U.S. PATENT DOCUMENTS

| | | | |
|---|---|---|---|
| 4,893,020 A * | 1/1990 | Ono | H01J 9/12 |
| | | | 250/483.1 |
| 5,641,967 A * | 6/1997 | Bringley | C09K 11/772 |
| | | | 252/301.4 H |

(Continued)

FOREIGN PATENT DOCUMENTS

JP    08184937 A    7/2016

OTHER PUBLICATIONS

Adams, et al., "A 2D pixelated stilbene scintillator detector array for simultaneous radiography with fast neutrons and gammas", arXiv: 2010.01870v3, Dec. 22, 2020, 22 Pages.

(Continued)

*Primary Examiner* — Kiho Kim
(74) *Attorney, Agent, or Firm* — Samantha Updegraff; Calfee, Halter & Griswold, LLP (57) ABSTRACT

A radiation detector includes a photodetector and a scintillator coupled thereto. The scintillator is formed of a scintillator material comprising an organic glass scintillator (OGS) material and at least one of a polymer additive or a plasticizer additive. The scintillator emits light when radiation is received at the scintillator, and the light is received by the photodetector. The radiation detector can further include a frame that has an interior cavity that holds the scintillator in position with respect to the photodetector, such that the light emitted by the scintillator is transmitted to the photodetector. The scintillator can be formed by casting amorphous scintillator material in the interior cavity of the frame. The frame can then be coupled to the photodetector to form the radiation detector.

20 Claims, 8 Drawing Sheets

(56) References Cited

U.S. PATENT DOCUMENTS

| | | | |
|---|---|---|---|
| 6,133,614 A * | 10/2000 | Shoji | H01L 27/14623 |
| | | | 257/443 |
| 9,845,334 B1 | 12/2017 | Feng et al. | |
| 10,330,798 B2 | 6/2019 | Shedlock et al. | |
| 10,508,233 B1 | 12/2019 | Feng et al. | |
| 11,479,717 B1 * | 10/2022 | Myllenbeck | G01T 1/203 |
| 2008/0121806 A1 * | 5/2008 | Grazioso | G01T 1/20185 |
| | | | 250/370.11 |
| 2010/0127180 A1 | 5/2010 | Lisfshitz et al. | |
| 2014/0332689 A1 * | 11/2014 | Van Loef | G01T 1/203 |
| | | | 250/361 R |
| 2015/0123036 A1 * | 5/2015 | Walker | G21K 4/00 |
| | | | 252/301.17 |
| 2015/0338529 A1 * | 11/2015 | Svenonius | G01T 1/2002 |
| | | | 264/135 |
| 2016/0186052 A1 | 6/2016 | Zaitseva et al. | |
| 2016/0355729 A1 | 12/2016 | Pecinovsky et al. | |
| 2018/0284294 A1 * | 10/2018 | Xie | H01L 31/02327 |
| 2018/0292547 A1 * | 10/2018 | Shedlock | G01T 1/20 |
| 2020/0400857 A1 | 12/2020 | Newman | |

OTHER PUBLICATIONS

Boo, et al., "Hand-held Dual-Particle Imager with Stilbene Array Coupled to SiPM Array," poster presented at Virtual 2020 IEEE Nuclear Science Symposium and Medical Imaging Conference, Nov. 4, 2020, 1 Page.

Cieslak, et al., "Pulse Shape Discrimination Performance of a Pixelated Plastic Scintillator (EJ-299-34) for a Coded-Aperture Based Dual Particle Imaging System", In Journal of Instrumentation, vol. 14, No. 7, International School of Advanced Studies and IOP Publishing, Jul. 25, 2019, 17 Pages.

Giha, et al., "Melt-Cast Organic Glass Scintillators for a Handheld Dual Particle Imager," poster presented at Virtual 2020 IEEE Nuclear Science Symposium and Medical Imaging Conference, Nov. 2020, 1 Page.

Gonzalez, et al., "Continuous or Pixelated Scintillators? Not Longer a Discussion", In 2014 IEEE Nuclear Science Symposium and Medical Imaging Conference, Nov. 2014, 4 Pages.

Manfredi, et al., "The Single-vol. Scatter Camera," Aug. 20, 2020, In Proceedings of SPIE, vol. 11494, 12 Pages.

Newby, et al., "Performance of Fast-Neutron Imaging Detectors Based on Plastic Scintillator EJ-299-34", OTNL/TM-2013/82, Feb. 28, 2013, 25 Pages.

Sabet, et al., "Fabrication of X-Ray/Gamma-ray Detector by Growth of Microcolumnar Csl:TI Onto Silicon Photomultipliers," In Physica Procedia, vol. 37, 2012, pp. 1523-1530.

Sweany, et al., "Design and Evaluation of a Pixelated PSD-capable Scintillator Detector with SiPM Readout", Retrieved From: https://doi.org/10.2172/1560807, SAND2019-10315, Sep. 1, 2019, 34 Pages.

Sweany, et al., "Position and Timing Resolution Measurements of Organic-Glass scintillator bars for the Optically Segmented Single-Volume Scatter Camera", Retrieved From: https://www.osti.gov/biblio/1642997-position-timing-resolution-measurements-oforganic-glass-scintillator-bars-opticallysegmented-single-volume-scatter-camera, SAND2019-12933C, Oct. 1, 2019, 1 Page.

* cited by examiner

SCINTILLATOR ARRAY FOR RADIATION DETECTION

RELATED APPLICATION

This application is a divisional of U.S. patent application Ser. No. 17/158,198, filed on Jan. 26, 2021, and entitled "SCINTILLATOR ARRAY FOR RADIATION DETECTION." The entirety of this application is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Radiation detectors find application in petroleum drilling and exploration, medical imaging, and radioactive material detection. Such detectors can be configured to detect various types of radiation, such as alpha radiation, beta radiation, gamma radiation, or neutron radiation. Conventionally, radiation detectors have employed a scintillator that is optically coupled to a photomultiplier tube to detect the interaction of radiation with the scintillator. More recently, pixelated silicon photomultipliers (SiPMs) capable of detecting single-photon events have been developed. In some applications, a scintillator coupled to a SiPM can have a high aspect ratio. Materials used for these scintillators have included stilbene crystals and certain types of radioluminescent plastics. However, these materials are poorly suited to high aspect ratio scintillators, such as those in a close-packed scintillator array, as they generally must be cut from a larger crystal or other element and then polished to achieve desired light emission and propagation characteristics. For high aspect ratio scintillators, these machining operations risk damaging the scintillator, reducing manufacturing yield, reliability, and/or performance.

SUMMARY

The following is a brief summary of subject matter that is described in greater detail herein. This summary is not intended to be limiting as to the scope of the claims.

Various technologies pertaining to a radiation detector and methods for manufacturing radiation detectors are described herein. With more particularity, technologies described herein pertain to a radiation detector that includes a scintillator that comprises an Organic Glass Scintillator (OGS) material, such as the materials disclosed in U.S. Pat. Nos. 9,845,334, and 10,508,233 the entireties of which are incorporated herein by reference. Radiation detectors described herein can be manufactured using non-subtractive methods such as mold casting or extrusion to form scintillator elements, which can improve the manufacturing yield, reliability, and/or performance of the radiation detectors relative to conventional radiation detectors that rely on stilbene or plastic scintillators.

In an exemplary embodiment, a radiation detector includes a photodetector and a scintillator coupled thereto. The photodetector can be or include a single-photon-sensitive device such as a single-photon avalanche diode (SPAD). The scintillator comprises an OGS material. The scintillator can further include at least one of a plasticizer additive or a polymer additive. Plasticizer and polymer additives can reduce the incidence of bubble formation and cracking due to thermal stresses. In non-limiting embodiments, the plasticizer additive can be or include any of various boron-containing compounds such as 2-(p-tolyl)-1,3,2-dioxaborinane (TDB), 1,3,5-tris(4,4,5,5-tetramethyl-1,3,2-dioxaborolan-2-yl)benzene (1,3,5-TrBB'), 2,2',2"-(benzene-1,2,4-triyl)tris(4,4,5,5-tetramethyl-1,3,2-dioxaborolane) (1,2,4-TrBB'), or the like, or an alkyl benzene such as mesitylene, xylenes, pseudocumene, etc. In further non-limiting embodiments, the polymer additive can be or include polystyrene (PS), polyvinyl toluene (PVT), polymethyl methacrylate (PMMA). In various embodiments, the plasticizer additive can be present at between 1-10 wt % of the total weight of the scintillator. In further embodiments, the polymer additive can be present at between 1-10 wt % of the total weight of the scintillator.

In various embodiments, the photodetector can include a plurality of photosensitive cells (e.g., the photodetector can be or include a SiPM that comprises a plurality of SPADs), and the radiation detector can include a plurality of scintillators each formed from an OGS material. The scintillators are positioned within a frame that is itself positioned above a surface of the photodetector, such that the scintillators are each aligned with a respective photosensitive cell. The frame is configured to optically isolate the scintillators and the photosensitive cells from one another, such that each photosensitive cell receives light from a single scintillator in the radiation detector.

Each of the scintillators can be formed within the frame, or a separate mold, that is configured to accept amorphous OGS material that is heated above its glass-transition temperature and to form the OGS material into a desired final shape of the scintillators. By way of example, the frame can include an interior cavity that has a same shape as the desired final shape of the scintillators. Amorphous OGS material can be added to the interior cavity and then cooled to form a scintillator. In some embodiments, the frame can be retained as a component of a radiation detector, holding a plurality of scintillators in place above a photodetector that has multiple photosensitive cells. In other embodiments, the scintillators can be formed in a mold that is distinct from a frame that is included in a radiation detector. In such embodiments, the scintillators, once formed in the mold, can be removed from the mold and installed in the frame. In still other embodiments, the scintillators can be formed by extrusion techniques rather than mold-based casting.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to radiation detectors are now described with reference to the drawings, wherein like reference numerals are used to refer to like elements throughout. With more particularity, technologies pertaining to a radiation detector that incorporates a scintillator that is composed of an OGS material and one or more polymer or plasticizer additives are described herein. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

Figure 1:
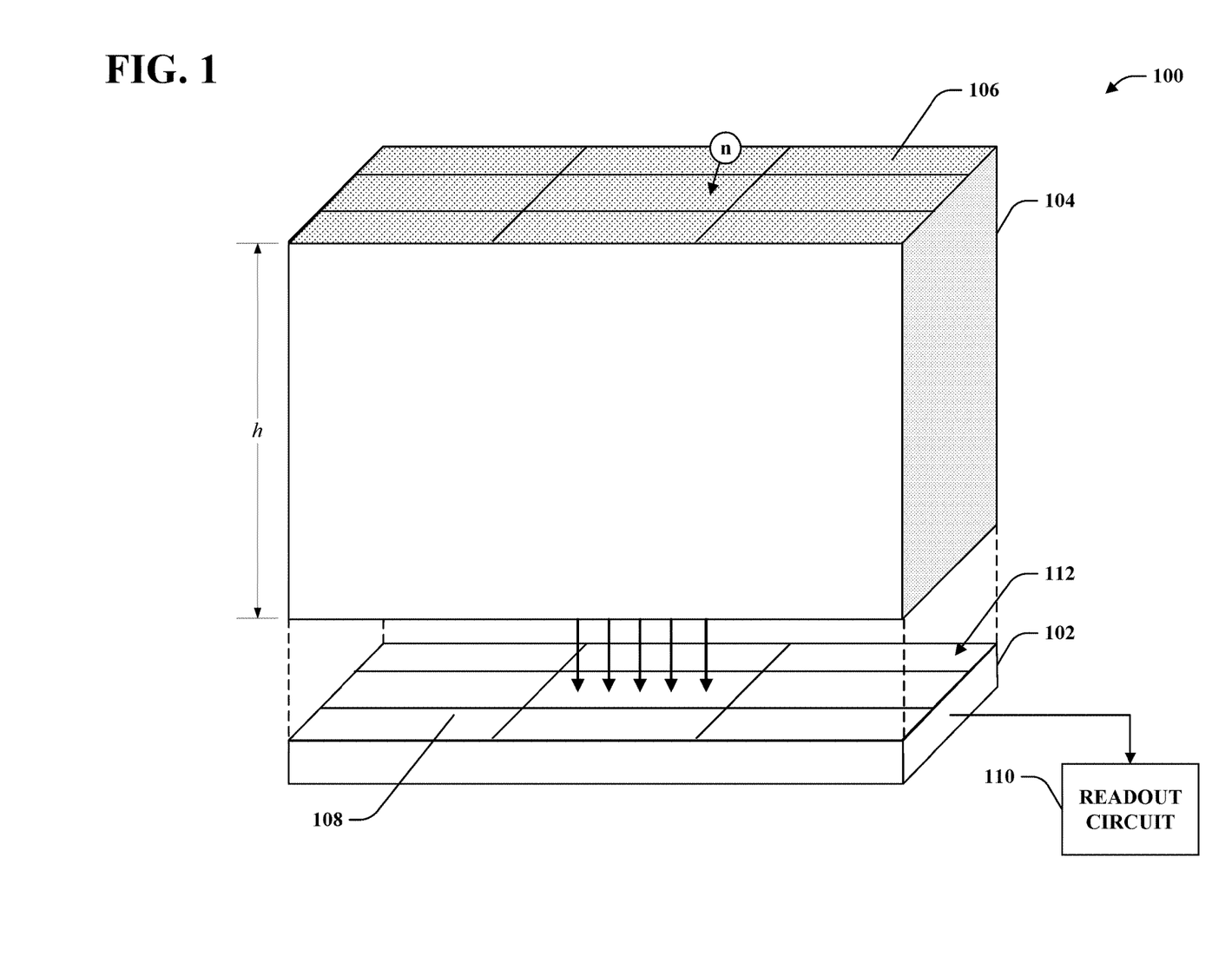
FIG. 1 is a perspective view of an exemplary radiation detector.

With reference to FIG. 1, an exemplary radiation detector 100 that facilitates detection of radiation events is illustrated. The detector 100 includes a photodetector 102, a frame 104, and a plurality of scintillators 106 that are positioned within the frame 104. The photodetector 102 can include a plurality of photosensitive cells 108. When radiation is incident upon one of the scintillators 106, the scintillator emits light. The light is received at one of the photosensitive cells 108 of the photodetector 102, and the photodetector 102 outputs an electrical signal that is indicative of which of the cells 108 received the light. Electrical signals output by the photodetector 102 can be received by a readout circuit 110 that is configured to output data indicative of light received at the photosensitive cells 108, which is in turn indicative of radiation received at the detector 100. For example, the readout circuit 110 can be configured to output data indicative of which of the photosensitive cells 108 received incident light, which is in turn indicative of which of the scintillators 106 received incident radiation. In other embodiments the readout circuit 110 can be configured to output data indicative of a direction from which radiation is received by the detector 100 responsive to incidence of multiple radiation events at the detector 100. As described in greater detail below, some functionality of the readout circuit 110 can be performed by or in conjunction with a computing device 800.

The radiation detector 100 is configured such that a scintillator at which a radiation event occurs can be identified based upon which of the photosensitive cells 108 receives light from the scintillators 106. Stated differently, the radiation detector 100 can be configured such that each of the photosensitive cells 108 receives light from a single respective scintillator in the scintillators 106. For example, and as shown in FIG. 1, the frame 104 can be positioned above and aligned with the photodetector 102. In exemplary embodiments, the frame 104 is configured so that each of the scintillators 106 is aligned with a respective photosensitive cell in the photosensitive cells 108. By way of example, the frame 104 can be configured such that each of the scintillators 106 has a bottom surface (not shown) the boundary of which is aligned with a boundary of a respective photosensitive cell on a surface 112 of the photodetector 102 that faces the bottom surface of the scintillator. In exemplary embodiments, the frame 104 and the photodetector 102 are coupled together such that the bottom surfaces of the scintillators 106 are in contact with the surface 112 of the photodetector 102.

Figure 2:
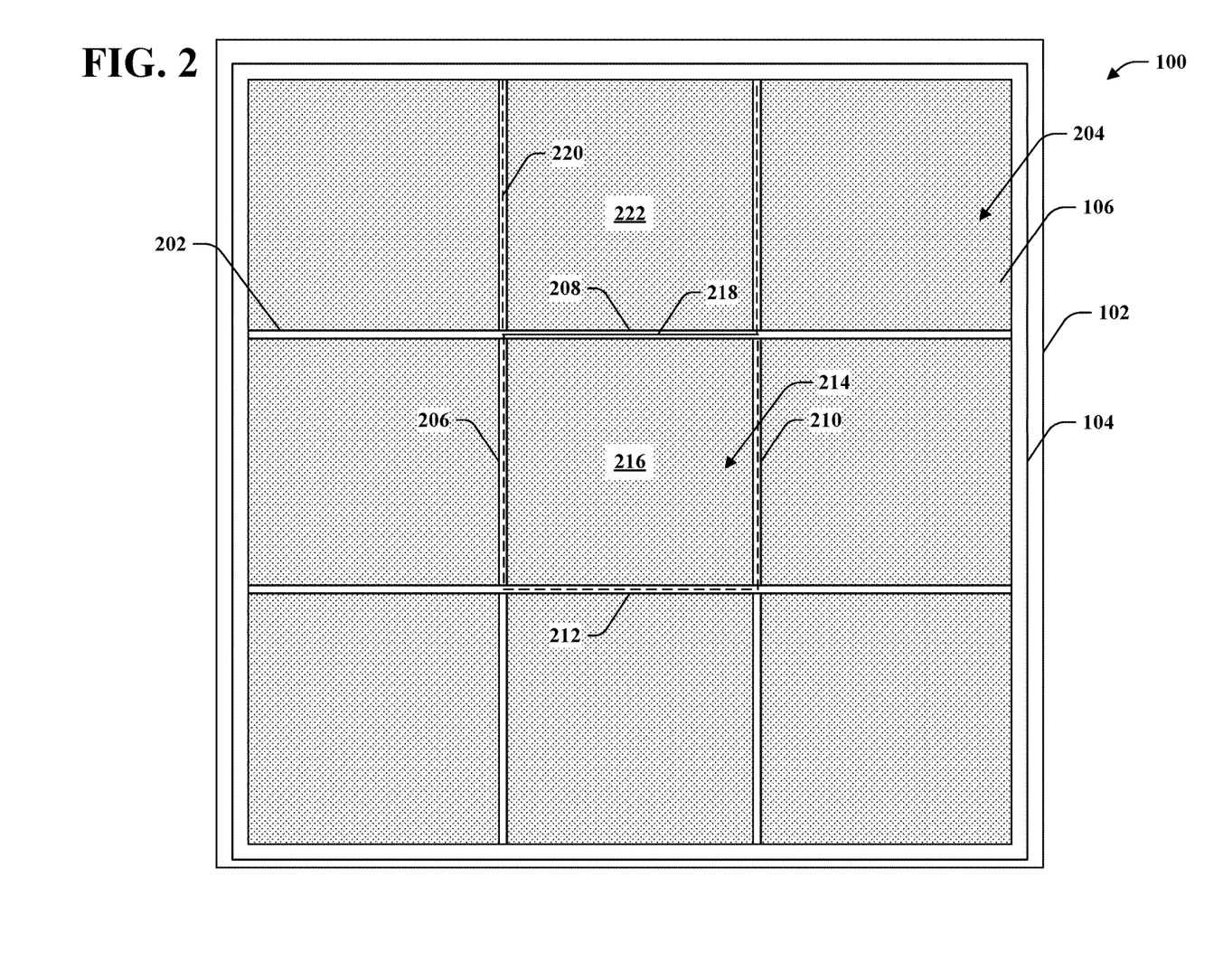
FIG. 2 is a top-down view of the exemplary radiation detector of FIG. 1.

With reference now to FIG. 2, a top-down view of the radiation detector 100 is shown. The frame 104 includes walls 202 that collectively define a plurality of interior cavities 204 in which the scintillators 106 are positioned. The walls 202 of the frame 104 are arranged such that each of the scintillators 106 is aligned over a respective photosensitive cell of the photodetector 102. For example, as shown in FIG. 2, the frame 104 includes four walls 206-212 that define a center interior cavity 214 that contains a center scintillator 216. The frame 104 can be configured such that the center scintillator 216 is centered over a center photosensitive cell of the photodetector 102, the outline of which photosensitive cell is labeled reference 218. Likewise, the frame 104 is configured such that the other scintillators 106 are centered over other photosensitive cells of the photodetector 102. In exemplary embodiments, the boundaries of the scintillators 106 can be substantially coextensive with the boundaries of the photosensitive cells 108. In such embodiments, the walls 202 of the frame 104 can be formed to have a same thickness as boundaries between the photosensitive cells 108 of the photodetector 102. In other embodiments, the boundaries of each of the scintillators 106 can lie entirely within a respective photosensitive cell of the detector 102. If the boundaries between the photosensitive cells 108 are thin, the walls 202 of the frame 104 can be positioned such that they overlap the boundaries between the photosensitive cells 108. For example, FIG. 2 shows that the wall 208 overlaps the boundary 218 of the center photosensitive cell, as well as a boundary 220 of a cell immediately adjacent to the center photosensitive cell. Accordingly, the center scintillator 216 and a scintillator 222 positioned adjacent to the center scintillator 216 have bottom-surface boundaries that lie entirely within the respective boundaries 218, 220 of their corresponding photosensitive cells.

Referring once again to FIG. 1, a height h of the frame 104 can be substantially the same as the length of the scintillators 106. The length of the scintillators 106 can be selected according to a type of radiation that is desirably detected by the radiation detector 100. For example, if the radiation detector 100 is configured for the detection of fast neutrons, the length of the scintillators 106 within the frame 104 can be selected such that a fast neutron that passes through a scintillator has a target probability of causing a scintillation event in that scintillator. Stated differently, if it is desired that 90% of fast neutrons passing through a scintillator are detected by that scintillator on average, a length of the scintillator can be selected such that a fast neutron passing through the scintillator has a target probability of 90% of causing a scintillation event within the scintillator (e.g., by interacting with one or more atoms in the scintillator). By way of example, and not limitation, the scintillators 106 can have a length of at least two inches in embodiments wherein the radiation detector 100 is configured to detect fast neutrons.

Since a length of the scintillators 106 is generally selected based upon a type of radiation that is to be detected by the detector 100, the aspect ratio of the scintillators 106 (i.e, their length divided by their width) increases as the density of the photosensitive cells 108 and corresponding scintillators 106 on the photodetector 102 is increased. Therefore, improving spatial resolution of the radiation detector 100 by adding more scintillator elements in a same device area can require an aspect ratio of the scintillators 106 to be increased. However, subtractive methods of scintillator manufacturing such as cutting and polishing of a larger workpiece, which are commonly used to form stilbene and plastic scintillators, are difficult to adapt to forming high-aspect-ratio scintillators.

The scintillators 106 comprise an OGS material, such as the OGS materials disclosed in U.S. Pat. Nos. 9,845,334, and 10,508,233, which are incorporated herein by reference. These materials exhibit improved light yield over conventional plastic and stilbene crystal scintillators, and further exhibit good neutron/gamma pulse-shape discrimination (PSD) and fast response time between an incident radiation event and peak light emission by the scintillator (e.g., less than 10 nanoseconds, less than 5 nanoseconds, or less than 2.5 nanoseconds). In some embodiments, the OGS material used to form the scintillators 106 can be selected to have a peak emission wavelength of between about 400 and about 600 nanometers.

The OGS material can also be formed into a high-aspect-ratio scintillator shape using non-subtractive methods such as mold casting or extrusion (e.g., as opposed to subtractive methods like cutting and polishing). Whereas these OGS materials have exhibited improved scintillation performance compared to conventional plastic and stilbene scintillators, scintillators formed from pure OGS materials have also exhibited some imperfections when manufactured in high-aspect-ratio form factors that are suitable for coupling with multi-celled photodetectors. In particular, some OGS materials exhibit cracking and bubble formation when cast using a mold.

In various embodiments, in addition to being composed of the OGS material, the scintillators 106 of the detector 100 further include a plasticizer additive and/or a polymer additive. Therefore, a scintillator material that makes up the scintillators 106 can include both an OGS material (e.g., selected from the OGS materials disclosed in U.S. Pat. Nos. 9,845,334, and 10,508,233) and one or both of a plasticizer or a polymer additive.

The addition of a plasticizer additive to the scintillator material can lower a glass transition temperature of the scintillator material, allowing amorphous scintillator material to flow more easily and improving the wetting of the material to a mold for casting. The addition of a plasticizer additive can reduce the potential for bubble formation within the amorphous scintillator material during cooling. The addition of a plasticizer additive can further improve the ductility of the scintillator material, mitigating the potential for cracking due to thermal stress during cooling. It has been found that the addition of a plasticizer in ranges of 1-10 wt %, 1-7.5 wt %, 1-5 wt %, 2.5-10 wt %, or 5-10 wt % of the total mass of the scintillator material are effective in improving the resilience of the scintillator material during mold casting or extruding to form the scintillators 106, while retaining scintillator performance of the OGS material.

The addition of a polymer additive can add strength and rigidity to a scintillator material. The polymer additive can therefore improve the resistance of a scintillator material to cracking due to thermal stress when cooling in a mold. It has been found that the addition of a polymer additive of up to 75 wt % of the total mass of the scintillator material (e.g., between 0 wt % and 75 wt %), or in ranges of 1-10 wt %, 1-7.5 wt %, 1-5 wt %, 2.5-10 wt %, or 5-10 wt % of the total mass of the scintillator material, are effective in improving the resilience of the scintillator material during mold casting or extruding to form the scintillators 106, while retaining scintillator performance of the OGS material.

Each of the plasticizer additive and the polymer additive can be selected to be transparent to wavelengths of light in the emission spectrum of the scintillators 106 when added to the OGS material. Exemplary plasticizer materials include boron-containing compounds such as 2-(p-tolyl)-1,3,2-dioxaborinane (TDB), and other boronic acid pinacol esters, such as those depicted in the structural diagrams reproduced below:

Still further exemplary plasticizers include 2,2',2"-(benzene-1,2,4-triyl)tris(4,4,5,5-tetramethyl-1,3,2-dioxaborolane) (1,2,4-TrBB), depicted in the following structural diagram:

or 1,2,4,5-tetrakis(4,4,5,5-tetramethyl-1,3,2-dioxaborolan-2-yl)benzene (TBB). Yet further exemplary plasticizer materials include phthalates, such as dioctyl phthalate, or alkyl benzenes, such as 1,3,5-trimethylbenzene (mesitylene), Xylenes (o-, m-, p-Xylene), 1,2,4-trimethylbenzene (pseudocumene), ethylbenzene, (Propan-2-yl)benzene (Cumene), 1-Methyl-4-(propan-2-yl)benzene (p-Cymene), or 1-Phenylhexane. Exemplary polymer additives include polystyrene, polyvinyl toluene, polymethyl methacrylate, polycarbonate, and polyethylene terephthalate.

In various embodiments, a molecular weight of a polymer can be selected according to a desired thermomechanical performance characteristic of the scintillator material. For example, a lower molecular weight polymer can be selected to yield lower viscosity, improving flowing performance during casting and facilitating wetting of the scintillator material with respect to walls of a mold. In other examples, a higher molecular weight polymer can be selected to yield a higher viscosity and greater strength of the scintillator material during cooling of the scintillator material. Still further, a molecular weight of the polymer can be selected to provide other specified mechanical properties such as impact toughness, tensile strength, or the like. In non-limiting embodiments, a molecular weight $M_n$ of a polymer additive can be 10,000-5,000,000 g/mol.

Figure 3:
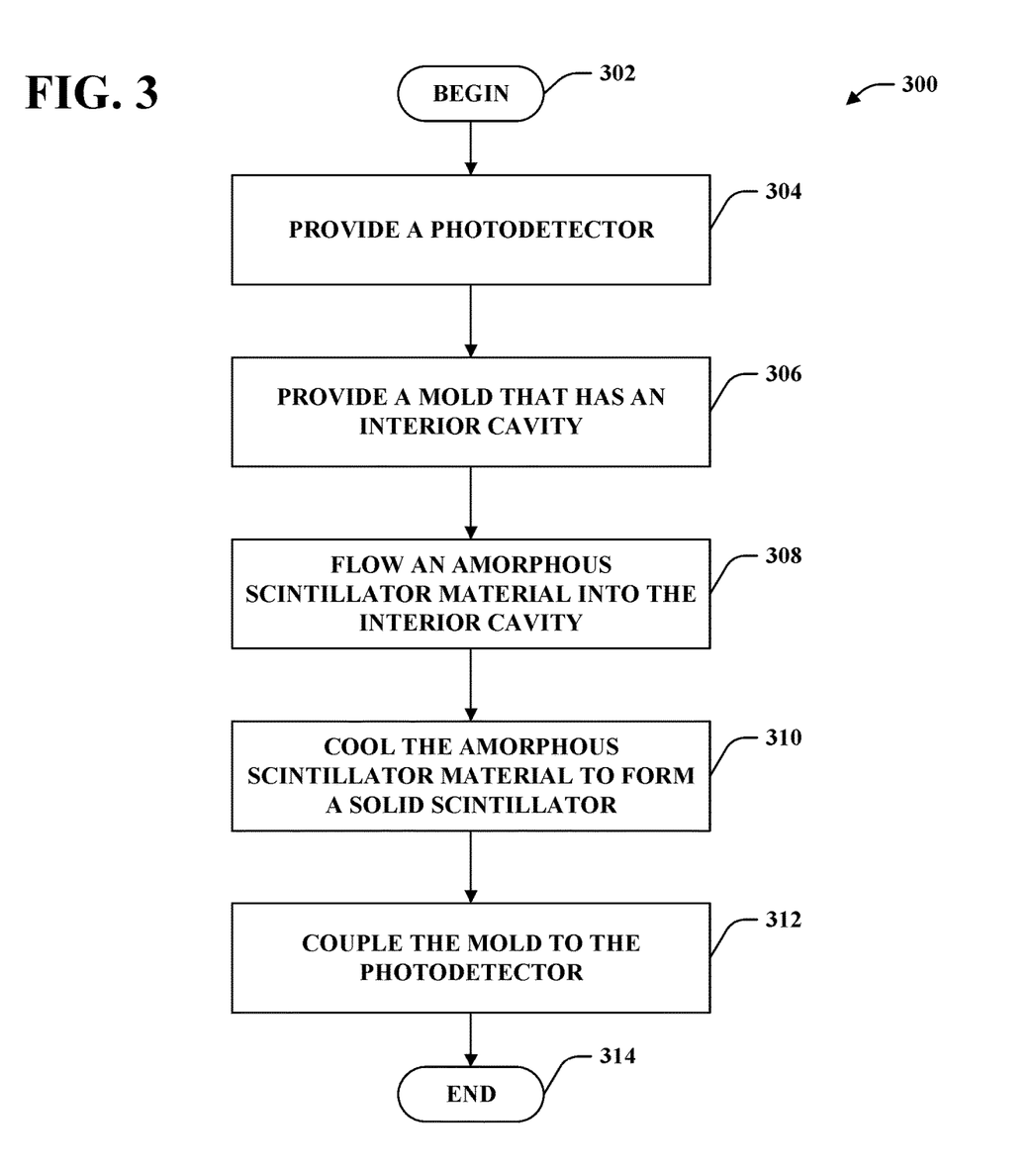
FIG. 3 is a flow diagram that illustrates an exemplary methodology for making a radiation detector.
Figure 4:
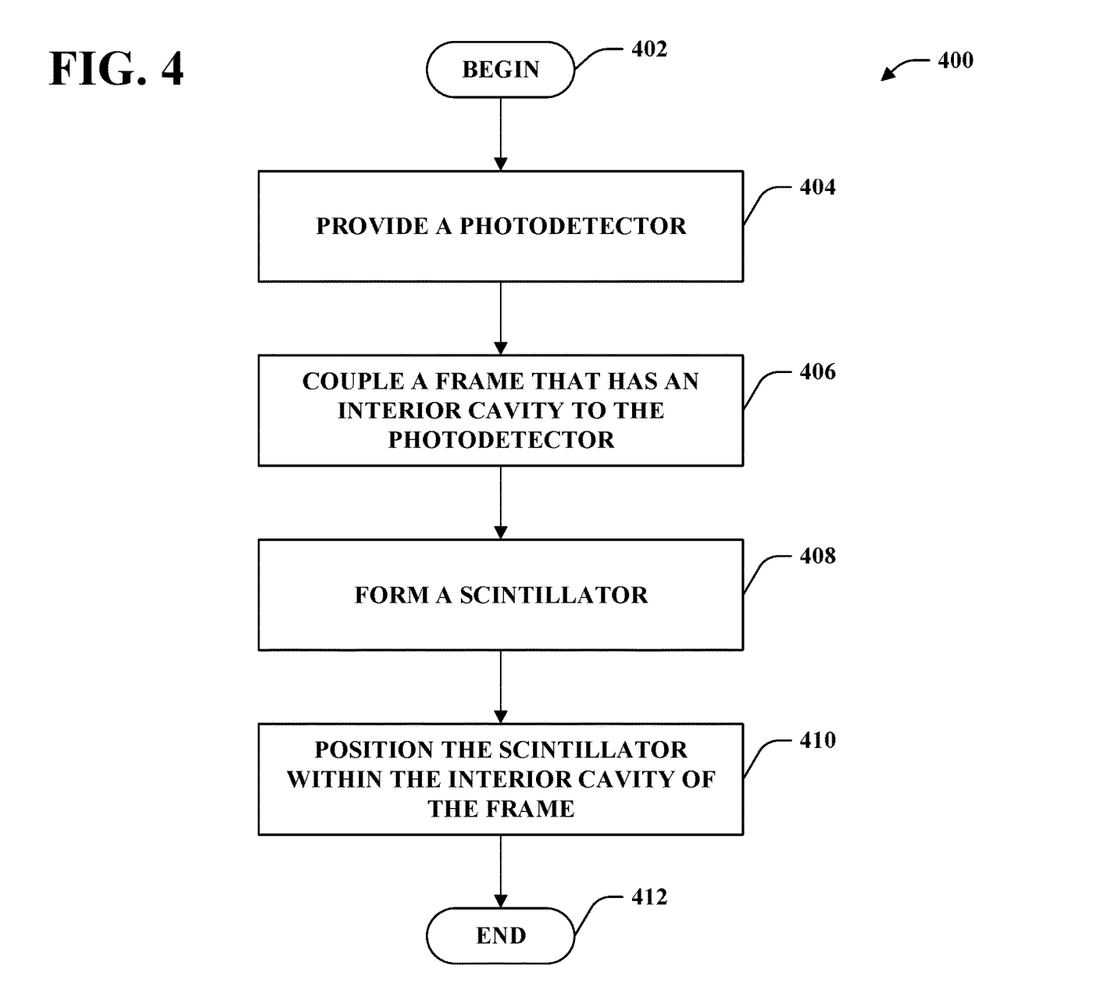
FIG. 4 is a flow diagram that illustrates another exemplary methodology for making a radiation detector.

As referenced above, the scintillators 106 can be formed using non-subtractive methods such as mold casting and extrusion that are suited to forming scintillators that have high aspect ratios. FIGS. 3-4 illustrate exemplary methodologies relating to manufacture of radiation detectors and OGS-based scintillators and scintillator arrays using non-subtractive methods. While the methodologies are shown and described as being a series of acts that are performed in Further exemplary plasticizer materials include 1,3,5-tris(4,4,5,5-tetramethyl-1,3,2-dioxaborolan-2-yl)benzene (1,3,5-TrBB), having the following structure:

a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 3, a methodology 300 that facilitates manufacture of a radiation detector by mold casting an OGS-based scintillator is illustrated. The methodology 300 begins at 302, and at 304 a photodetector is provided. The photodetector can be a photodetector that includes a plurality of photosensitive cells, such as a SiPM or an electron-multiplying charge-coupled device (CCD) array. At 306, a mold that has an interior cavity is provided. In exemplary embodiments, the mold can have a plurality of interior cavities that have a size and spacing that corresponds to size and spacing of a plurality of photosensitive cells included on the photodetector. In a non-limiting example, the mold can be configured in similar manner to the frame 104. At 308, an amorphous scintillator material is flowed into the interior cavity of the mold. The amorphous scintillator material can comprise an OGS material and at least one of a plasticizer additive or a polymer additive. The scintillator material is heated above its glass transition temperature and allowed to flow into the interior cavity of the mold. At 310 the amorphous scintillator material is cooled to form a solid scintillator element that has a same shape as the interior cavity of the mold. At 312, the mold, including the cooled scintillator element disposed therein, is coupled to the photodetector. The mold can be coupled to the photodetector such that the photodetector receives light that is emitted by the scintillator responsive to radiation being incident on the scintillator. In an exemplary embodiment, the mold is coupled to the photodetector such that a bottom surface of the scintillator is in contact with a surface of a photosensitive cell of the photodetector, e.g., by using an optical coupling material positioned between the bottom surface of the scintillator and a surface of the photosensitive cell. The mold can be coupled to the photodetector using any of various means such as fasteners, adhesives, or the like. The methodology 300 ends at 314.

With reference now to FIG. 4, another exemplary methodology 400 for manufacturing a radiation detector is illustrated. The methodology 400 begins at 402, and at 404 a photodetector is provided. At 406 a frame that has an interior cavity is coupled to the photodetector. At 408, a scintillator is formed. The scintillator can be formed from a scintillator material that comprises an OGS material and one or more of a plasticizer additive or a polymer additive. The scintillator can be formed, for example, by casting scintillator material in a mold that is distinct from the frame coupled to the photodetector at 406. In other embodiments, the scintillator can be formed by extruding the scintillator material into the desired shape of the scintillator. At 410, the scintillator formed at 408 can be positioned within the interior cavity of the frame that is coupled to the photodetector. The methodology 400 ends at 414. From the foregoing, it is to be understood that scintillators can be cast directly in a frame that will be used to position the scintillators with respect to a photodetector as described with respect to FIG. 3, or the scintillators can instead be formed separately through any suitable means and later positioned within a frame as described with respect to FIG. 4.

Referring once again to FIGS. 1 and 2, the frame 104 can be configured to optically isolate each of the scintillators 106 from one another. Thus, light emitted by one of the scintillators 106 is prevented by the walls 202 of the frame 104 from being transmitted through any of the other scintillators 106. In some embodiments, the frame 104 can be formed from a material that is substantially opaque to wavelengths of light emitted by the scintillators 106. The frame 104 can be formed from any of various materials such as metals, plastics, composite materials, ceramics, etc. In non-limiting embodiments, the material used to form the frame 104 can be tailored to a type of radiation that the radiation detector 100 is designed to detect. For instance, the material used to form the frame 104 can be selected based upon the material being substantially non-interactive with radiation that is desirably detected by the radiation detector 100. By way of example, and not limitation, the frame 104 can be constructed of metal rather than a plastic when the radiation detector 100 is configured to detect neutron radiation.

Light emitted by the scintillators 106 can be transmitted along the lengths of the scintillators by total internal reflection within the frame 104. In some embodiments, the walls 202 of the frame 104 can be coated with a reflective material to facilitate transmission of light emitted by the scintillators 106 to the photosensitive cells 108 of the photodetector 102. By way of example, and not limitation, the walls 202 of the frame 104 can be coated with a specular reflective film. In other embodiments, the walls 202 of the frame 104 can be coated with a diffuse reflective material. In various embodiments, the reflective material has a reflectivity of at least 90%, at least 95%, or at least 99% with respect to light within the emission spectrum of the scintillators 106. In non-limiting examples, the reflective material can be configured to have the desired reflectivity within a bandwidth of 75 nanometers centered at about 420 nanometers, 450 nanometers, or 540 nanometers. In other embodiments, the walls 202 of the frame 104 can be electropolished to have the desired reflectivity (e.g., at least 90%, at least 95%, or at least 99% with respect to the emission spectrum of the scintillators 106). In embodiments wherein the mold in which scintillators are cast is used as a frame to position the scintillators over photosensitive cells of the photodetector (e.g., the frame 104), the scintillator material can be substantially conformal to an interior surface of the mold.

Figure 5:
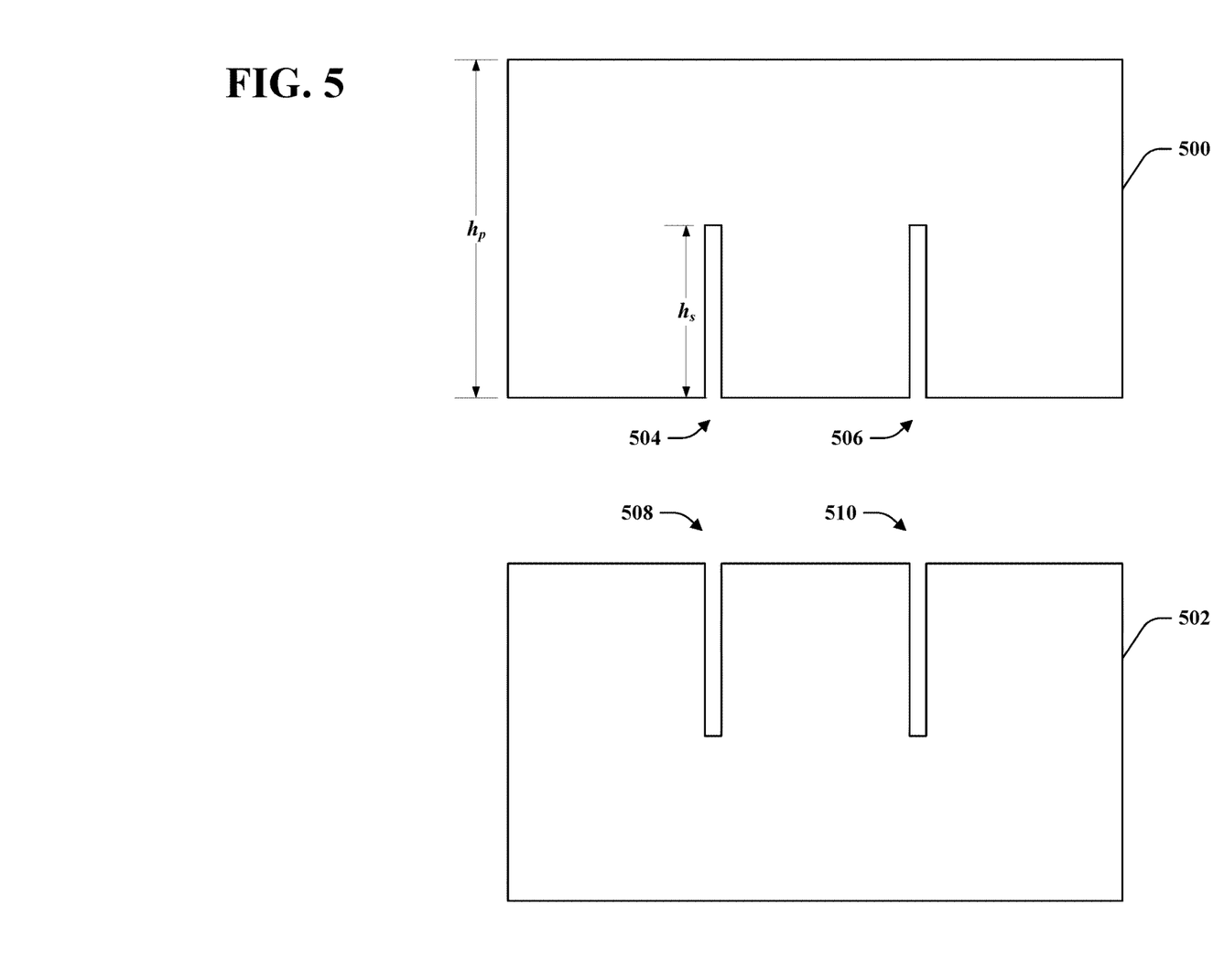
FIG. 5 is a side-view diagram of exemplary frame components.

The frame 104 can be formed as a monolithic piece, for example by machining a workpiece to form the frame 104, or by additive manufacturing methods such as selective deposition and sintering or curing of material layers. In other embodiments, the frame 104 can be formed from multiple pieces that are joined together. Referring now to FIG. 5, slotted pieces 500, 502 that can be joined to form a frame are shown. The slotted piece 500 is a substantially rectangular sheet that includes a first slot 504 and a second slot 506. The slotted piece 502 is a substantially rectangular sheet that includes a first slot 508 and a second slot 510. The slotted pieces 500, 502 can be formed by machining, stamping, casting, or otherwise shaping any of various materials such as metals or plastics. Walls of a frame can be formed by mating slots of slotted pieces to one another. For example, the slotted pieces 500, 502 can be joined at right angles to one another by mating a corresponding pair of slots of the pieces 500, 502, such as the slot 504 of the piece 500 with the slot 508 of the piece 502. A height $h_p$ of the slotted pieces 500, 502 can be selected to be substantially equal to a desired length of the scintillators 106 (e.g., based upon a type of radiation that is desirably detected). A height $h_s$ of the slots 504-510 within the slotted pieces 502 can be approximately half of the height $h_p$ to facilitate joining of the pieces 500, 502 to one another.

Figure 6:
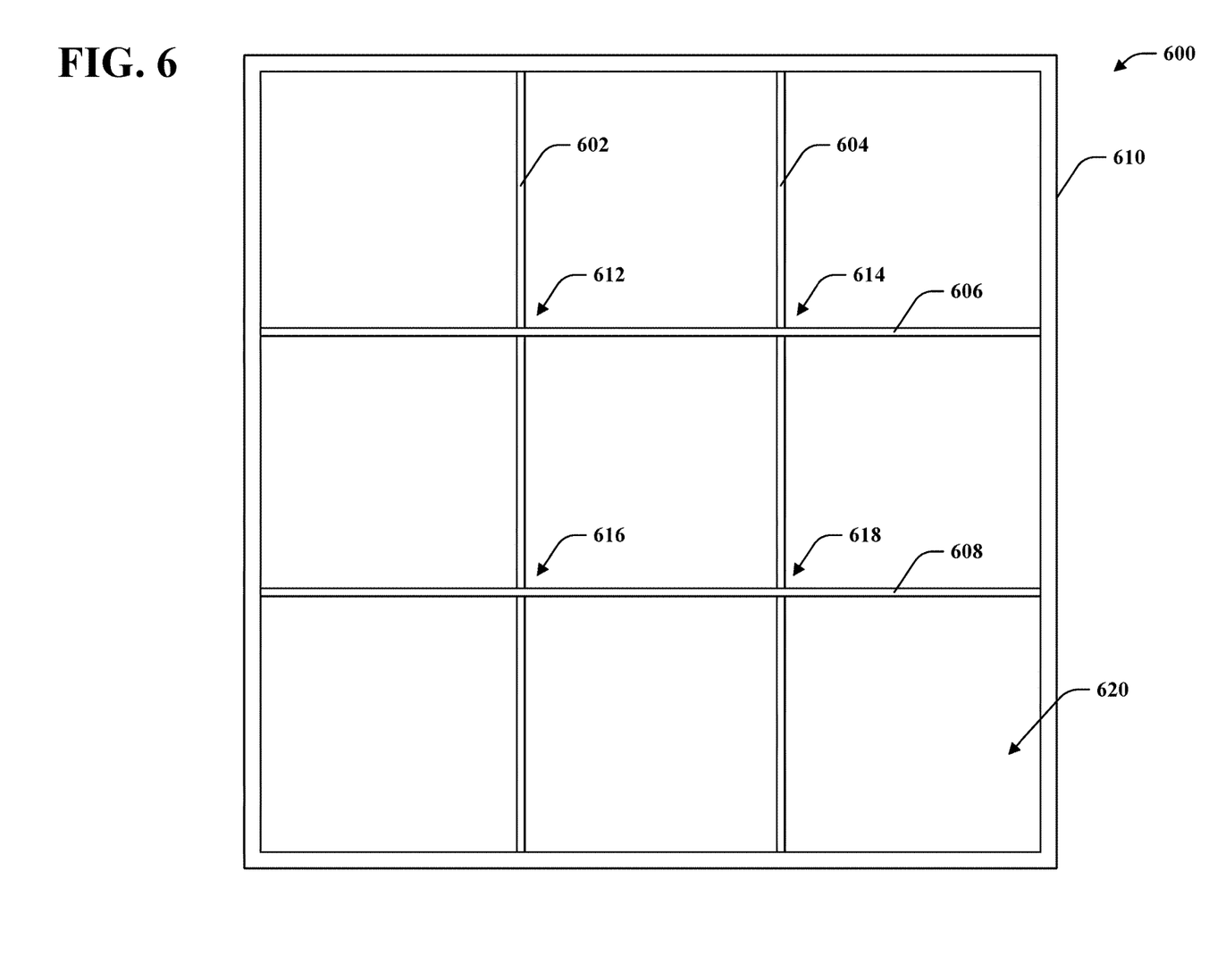
FIG. 6 is a top-down view of an exemplary frame formed by joining slotted frame components.

It is to be understood that a number of slots in the slotted pieces 500, 502 can be selected based upon a number of the slotted pieces that are desirably joined together to form a frame. In turn, a number of the slotted pieces that are joined together can depend upon a number of scintillators that are intended to be held by the frame. By way of further illustration, and referring now to FIG. 6, an exemplary frame 600 is shown that comprises four slotted pieces 602-608, wherein each of the slotted pieces 602-608 has two slots each. For example, the slotted pieces 602-608 can be configured similarly to the slotted pieces 500, 502. The slotted pieces 602-608 are each configured to be joined to two other of the slotted pieces 602-608. The frame 600 can further include an outer portion 610 that surrounds the slotted pieces, thereby providing an exterior wall of the frame 600. The outer portion 610 can be, for example, a hollow rectangular prism that is open at both ends (e.g., extending into the page), such that the slotted pieces 602-608 are disposed inside the prism. In other embodiments, slotted pieces can be configured such that an exterior of the frame 600 is defined by multiple slotted pieces joined similarly to the slotted pieces 602-608, rather than by the distinct outer portion 610. For instance, each of four sides of the outer portion 610 could instead be formed by a respective slotted piece. The slotted pieces 602-608 are joined at intersections 612-618 where slots of two slotted pieces are joined together. With greater specificity, the slotted piece 602 is joined at right angles with the slotted piece 606 by way of a first slot at intersection 612, and is further joined at right angles with the slotted piece 608 by way of a second slot at intersection 616. Likewise, the slotted piece 604 is joined at right angles with the slotted piece 606 by way of a third slot at intersection 614, and is further joined at right angles with the slotted piece 608 by way of a fourth slot at intersection 618. Collectively, the slotted pieces 602-608 and the outer portion 610 of the frame 600 define nine interior cavities 620.

While the scintillators 106 and the interior cavities 204 of the frame 104 depicted in FIGS. 1 and 2 are shown as having square profiles, such that the scintillators have the shape of square prisms, it is to be understood that other geometries of the scintillators 106 are contemplated as being within the scope of the present disclosure. In a non-limiting example, and referring now to FIG. 7, a top-down view of an exemplary detector 700 is shown, wherein the detector 700 includes a photodetector 702 and a plurality of framing elements 704 that are configured to hold cylindrical scintillators 706. The framing elements 704 can be considered to collectively define a frame for the scintillators 706. The framing elements 704 can be hollow cylinders in which the cylindrical scintillators 706 are disposed. The framing elements 704 can be centered over photosensitive cells 708 of the photodetector 702 such that each of the photosensitive cells 708 receives light from a single respective scintillator in the scintillators 706. The scintillators 706 can be cast in the framing elements 704 individually, and the framing elements 704 later coupled to the photodetector 702 and/or joined together. Casting the scintillators 706 individually can mitigate the loss due to manufacturing defects (e.g., thermal cracking of the scintillators 706), since a single faulty scintillator can be discarded and recast prior to inclusion in the detector 700.

Figure 7:
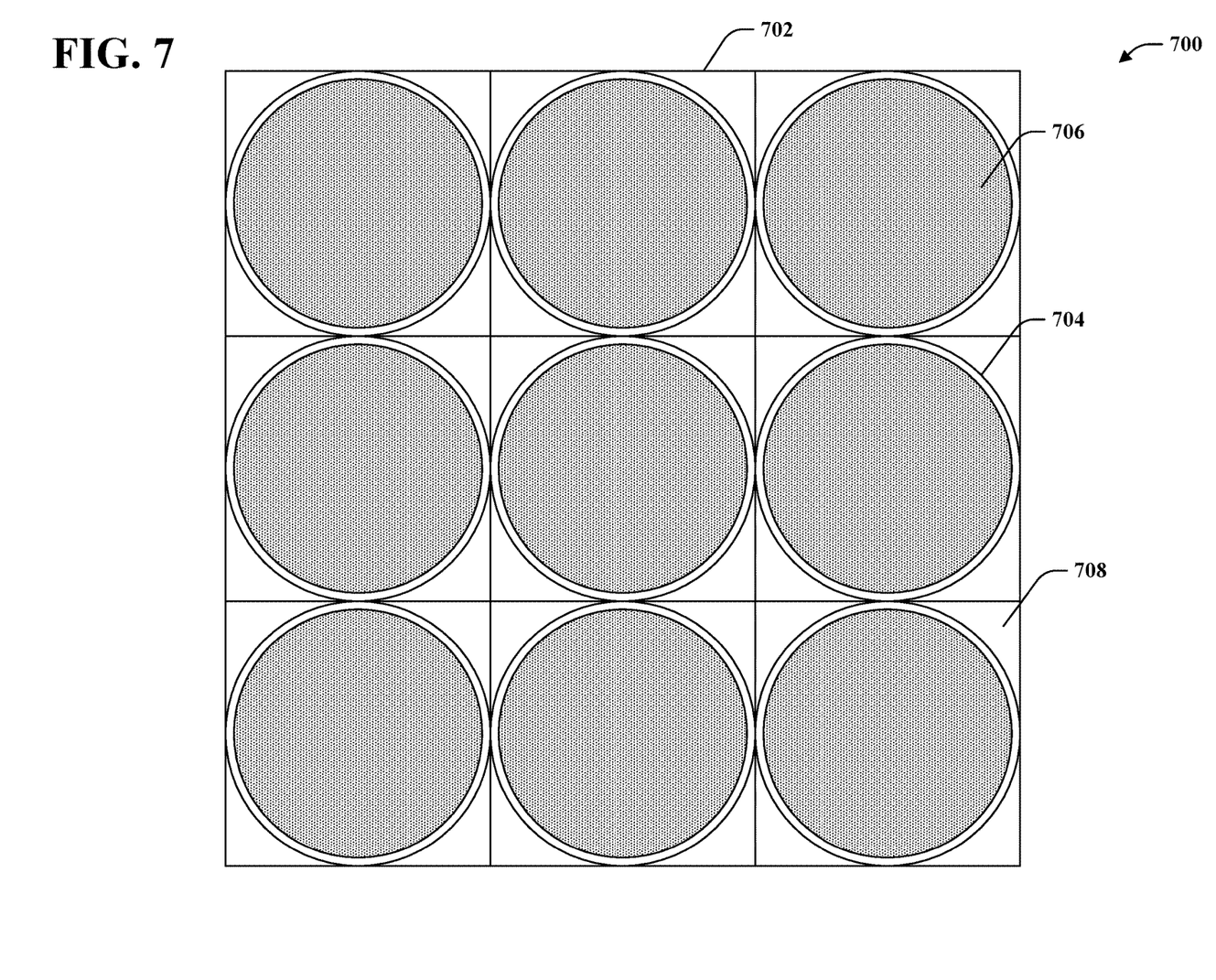
FIG. 7 is a top-down view of another exemplary radiation detector.

Further, while the detectors 100, 700 are shown as including nine scintillators 106, 706 each, it is to be understood that a radiation detector including substantially any number of scintillators is contemplated as being within the scope of the present disclosure. In various embodiments, a radiation detector includes a same number of scintillators as there are photosensitive cells in the detector, such that each photosensitive cell is coupled to a different respective scintillator. In such embodiments, a frame or mold can be configured to have a same number of interior cavities as a number of scintillators that are desirably included in the detector. In various embodiments, a radiation detector constructed in accordance with the present disclosure can have 100 or more scintillators, 256 or more scintillators, or greater than 1,000 scintillators.

Figure 8:
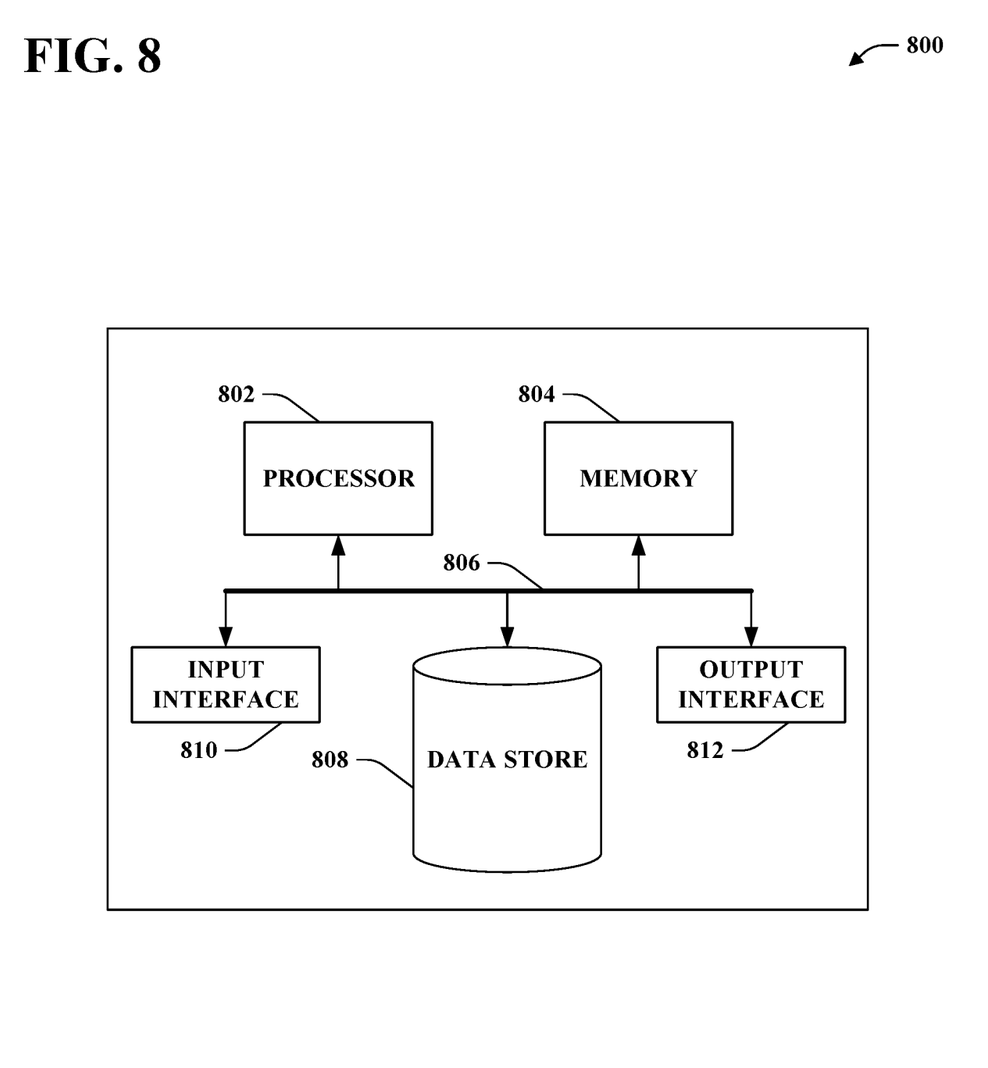
FIG. 8 is an exemplary computing system.

Referring now to FIG. 8, a high-level illustration of an exemplary computing device 800 that can be used in accordance with the systems and methodologies disclosed herein is illustrated. For instance, the computing device 800 may be used in conjunction with the radiation detector 100 to compute and output data pertaining to radiation events incident on the detector 100. The computing device 800 includes at least one processor 802 that executes instructions that are stored in a memory 804. The instructions may be, for instance, instructions for implementing functionality described as being carried out by one or more components discussed above or instructions for implementing one or more of the methods described above. The processor 802 may access the memory 804 by way of a system bus 806. In addition to storing executable instructions, the memory 804 may also store data pertaining to radiation detection events.

The computing device 800 additionally includes a data store 808 that is accessible by the processor 802 by way of the system bus 806. The data store 808 may include executable instructions, data pertaining to past radiation detection events, etc. The computing device 800 also includes an input interface 810 that allows external devices to communicate with the computing device 800. For instance, the input interface 810 may be used to receive instructions or other data from an external computer device, from a user, from the readout circuit 110 of the radiation detector 100, etc. In an exemplary embodiment, the readout circuit 110 receives an electrical signal output by the photodetector 102, and outputs data indicative of which of the photosensitive cells 108 received light from the scintillators 106 and an intensity of the light received (e.g., as indicated by the electrical signal output by the photodetector 102). For example, the readout circuit 110 can output timestamped data that indicates, for each of the photosensitive cells 108 in the photodetector 102, an intensity of light received by the photosensitive cell. The computing device 800 can receive the data output by the readout circuit 110 by way of the input interface 810. Responsive to receipt of the data, the computing device 800 can compute one or more parameters related to radiation received by the detector. For instance, responsive to receipt of such data over a period of time, the computing device 800 can compute an intensity of radiation received at the detector 100 or a direction from which the radiation was received.

The computing device 800 also includes an output interface 812 that interfaces the computing device 800 with one or more external devices. For example, the computing device 800 may display text, images, or the like that pertain to radiation detection events to a user of the computing device 800 by way of the output interface 812.

It is contemplated that the external devices that communicate with the computing device 800 via the input interface 810 and the output interface 812 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 800 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 800 may be a distributed system. Thus, for instance, several devices may be in communication by way of a network connection and may collectively perform tasks described as being performed by the computing device 800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for making a radiation detector, the method comprising:
   providing a photodetector;
   providing a mold, the mold having an interior cavity;
   flowing an amorphous scintillator material into the interior cavity of the mold, the amorphous scintillator material comprising an organic glass scintillator (OGS) material and at a plasticizer additive, wherein the plasticizer additive is present in the amorphous scintillator material at a concentration of between 1% and 10% of a mass of the amorphous scintillator material;
   cooling the amorphous scintillator material within the interior cavity to form a scintillator; and
   coupling the mold to the photodetector such that the photodetector receives light that is emitted by the scintillator responsive to incidence of radiation at the scintillator.

2. The method of claim 1, further comprising electropolishing a surface of the interior cavity of the mold prior to flowing the amorphous scintillator material into the interior cavity, such that the surface of the interior cavity has a reflectivity of at least 90% with respect to wavelengths of light emitted by the scintillator.

3. The method of claim 1, further comprising applying a reflective coating to a surface of the interior cavity prior to flowing the amorphous scintillator material into the interior cavity.

4. The method of claim 1, wherein the light emitted by the scintillator has a peak emission wavelength of between 400 nanometers and 600 nanometers.

5. The method of claim 1, further comprising:
   providing a second mold, the second mold having a second interior cavity;
   flowing the amorphous scintillator material into the second interior cavity of the second mold;
   cooling the amorphous scintillator material within the second interior cavity to form a second scintillator; and
   coupling the second mold to the photodetector such that the photodetector receives second light that is emitted by the second scintillator responsive to incidence of radiation at the second scintillator.

6. The method of claim 5, wherein the photodetector comprises a first cell and a second cell, the method further comprising:
   aligning the first cell of the photodetector with the scintillator such that the light emitted by the scintillator is received by the first cell but is not received by the second cell; and
   aligning the second cell of the photodetector with the second scintillator such that the second light emitted by the second scintillator is received by the second cell but is not received by the first cell.

7. The method of claim 1, wherein the interior cavity has an interior surface, the method further comprising coating the interior surface of the interior cavity with a reflective coating, where the reflective coating has a reflectivity of greater than 90% with respect to the light emitted by the scintillator.

8. The method of claim 1, wherein the photodetector is one of a silicon photomultiplier (SIPM) or a charge-coupled device (CCD).

9. The method of claim 1, where the amorphous scintillator material comprises the plasticizer additive, and further where the plasticizer additive is a compound that comprises boron.

10. The method of claim 9, wherein the compound comprising boron is one of:
- boronic pinacol esters;
- 2-(p-tolyl)-1,3,2-dioxaborinane (TDB);
- 1,3,5-tris (4,4,5,5-tetramethyl-1,3,2-dioxaborolan-2-yl) benzene ('1,3,5-TrBB');
- 2,2',2"-(benzene-1,2,4-triyl) tris (4,4,5,5-tetramethyl-1,3,2-dioxaborolane) ('1,2,4-TrBB'); and
- 1,2,4,5-tetrakis (4,4,5,5-tetramethyl-1,3,2-dioxaborolan-2-yl) benzene (TBB).

11. The method of claim 1, wherein the amorphous scintillator material further comprises a polymer.

12. A system comprising:
- a photodetector that comprises a first photosensitive cell and a second photosensitive cell;
- a frame that defines a first interior cavity and a second interior cavity, wherein the first interior cavity and the second interior cavity are separated from one another, and wherein the first interior cavity is aligned with the first photosensitive cell and the second interior cavity is aligned with the second photosensitive cell;
- a first scintillator element positioned within the first interior cavity, the first scintillator element comprising an organic glass scintillator (OGS) material and a plasticizer additive or a polymer, wherein the plasticizer additive is present in the first scintillator element at a concentration of between 1% and 10% of a mass of the first scintillator element; and
- a second scintillator element positioned within the second interior cavity, where:
    - the first interior cavity and the first photosensitive cell are aligned such that first light emitted by the first scintillator element is received by the first scintillator cell but is not received by the second scintillator cell; and
    - the second interior cavity and the second photosensitive cell are aligned such that second light emitted by the second scintillator element is received by the second scintillator cell but is not received by the first scintillator cell.

13. The system of claim 12, where the plasticizer additive is one of:
- mesitylene;
- pseudocumene;
- ethylbenzene;
- cumene;
- p-Cymene; or
- 1-Phenylhexane.

14. The system of claim 12, wherein the second scintillator element comprises the OGS material and the plasticizer additive.

15. The system of claim 14, wherein the plasticizer additive is present in the second scintillator element at a concentration of between 1% and 10% of a mass of the second scintillator element.

16. The system of claim 12, where the first scintillator element additionally includes a polymer.

17. The system of claim 12, wherein the first interior cavity is coated with a reflective coating and the second interior cavity is coated with the reflective coating.

18. A system for making a radiation detector, the system comprising:
- a photodetector;
- a mold that has an interior cavity;
- amorphous scintillator material, where the interior cavity of the mold is configured to receive the amorphous scintillator material, and further where the amorphous scintillator material comprises an organic glass scintillator (OGS) material and a plasticizer additive, wherein the plasticizer additive is present in the amorphous scintillator material at a concentration of between 1% and 10% of a mass of the amorphous scintillator material, where the amorphous scintillator material is cooled within the interior cavity to form a scintillator, and further where the mold is coupled to the photodetector such that the photodetector receives light that is emitted by the scintillator responsive to incidence of radiation at the scintillator.

19. The system of claim 18, where the amorphous scintillator material comprises the plasticizer additive, and further where the plasticizer additive is a compound that comprises boron.

20. The system of claim 18, wherein the amorphous scintillator material further comprises a polymer.

* * * * *